(12) United States Patent
Hishiya

(10) Patent No.: US 7,465,682 B2
(45) Date of Patent: Dec. 16, 2008

(54) METHOD AND APPARATUS FOR PROCESSING ORGANOSILOXANE FILM

(75) Inventor: Shingo Hishiya, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/553,191

(22) PCT Filed: Apr. 20, 2004

(86) PCT No.: PCT/JP2004/005627

§ 371 (c)(1),
(2), (4) Date: Oct. 13, 2005

(87) PCT Pub. No.: WO2004/097920

PCT Pub. Date: Nov. 11, 2004

(65) Prior Publication Data

US 2006/0189161 A1    Aug. 24, 2006

(30) Foreign Application Priority Data

Apr. 25, 2003    (JP) .............................. 2003-121586

(51) Int. Cl.
*H01L 21/31* (2006.01)
(52) U.S. Cl. ................ 438/790; 438/787; 257/E21.261
(58) Field of Classification Search ................ 438/781, 438/782, 787, 790
See application file for complete search history.

(56) References Cited

U.S. PATENT DOCUMENTS 4,847,162 A * 7/1989 Haluska et al. .............. 428/457
5,262,201 A * 11/1993 Chandra et al. ............ 427/376.2
5,688,116 A * 11/1997 Kobayashi et al. ............ 432/12
5,789,325 A * 8/1998 Chandra et al. ............. 438/781
6,306,776 B1 * 10/2001 Srinivasan et al. ........... 438/758
2002/0045361 A1 * 4/2002 Cheung et al. .............. 438/790

FOREIGN PATENT DOCUMENTS

| JP | 5-6858 | 1/1993 |
| JP | 5-295549 | 11/1993 |
| JP | 6-283520 | 10/1994 |
| JP | 7-115136 | 5/1995 |
| JP | 7-283212 | 10/1995 |
| JP | 8-125197 | 5/1996 |
| JP | 10-209144 | 8/1998 |
| JP | 2001-206710 | 7/2001 |
| JP | 2001-308089 | 11/2001 |
| JP | 2003-158126 | 5/2003 |

* cited by examiner

Primary Examiner—Walter L Lindsay, Jr.
Assistant Examiner—Reema Patel
(74) Attorney, Agent, or Firm—Oblon, Spivak, McClelland, Maier & Neustadt, P.C.

(57) ABSTRACT

A method for processing an organosiloxane film includes loading a target substrate (W) with a coating film formed thereon into a reaction chamber (2), and performing a heat process on the target substrate (W) within the reaction chamber (2) to bake the coating film. The coating film contains a polysiloxane base solution having an organic functional group. The heat process includes a temperature setting step of setting an interior of the reaction chamber (2) at a process temperature by heating, and a supplying step of supplying a baking gas into the reaction chamber (2) set at the process temperature, while activating the baking gas by a gas activation section (14) disposed outside the reaction chamber (2).

3 Claims, 3 Drawing Sheets

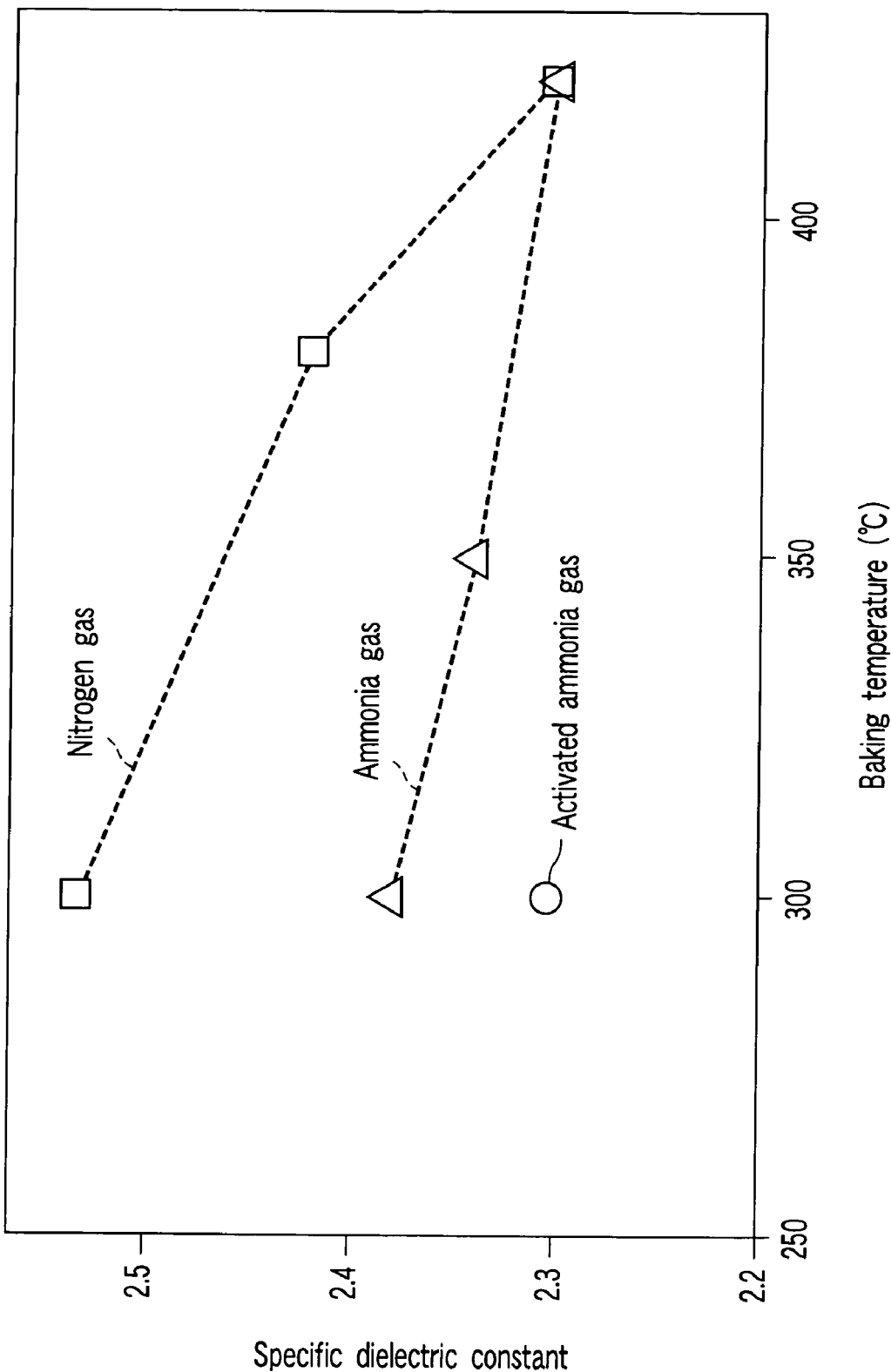
F I G. 2

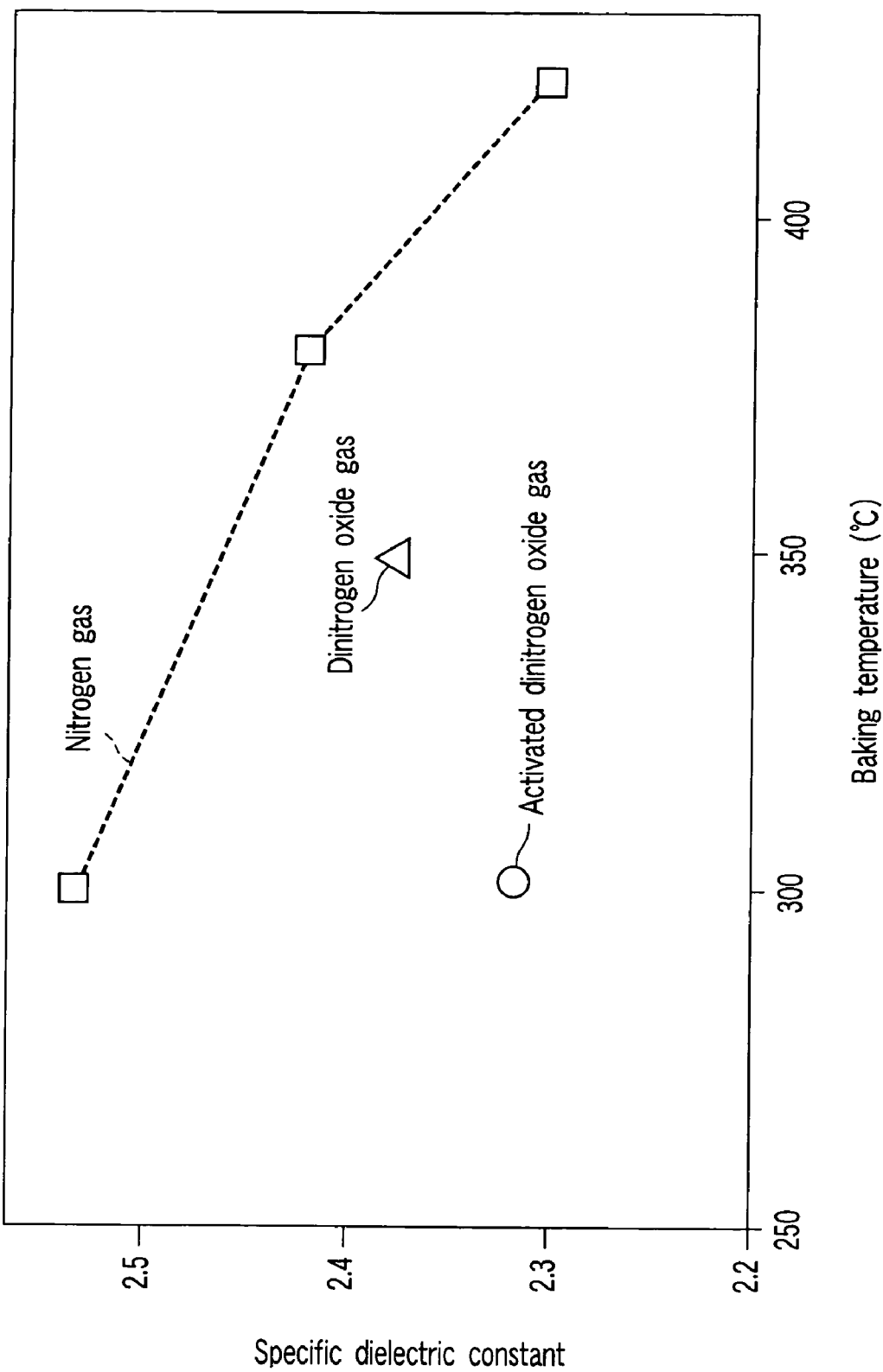
F I G. 3

METHOD AND APPARATUS FOR PROCESSING ORGANOSILOXANE FILM

TECHNICAL FIELD

The present invention relates to a method and apparatus for processing an organosiloxane film by performing a heat process on a target substrate with a coating film of a polysiloxane base solution applied thereon, thereby baking the coating film.

BACKGROUND ART

In order to increase the operational speed of LSIs, it is required to decrease the specific dielectric constant of inter-level insulating films. As an inter-level insulating film with a low dielectric constant, an organosiloxane film is known. Where an organosiloxane film is formed, a coating film of a polysiloxane base solution having an organic functional group is first formed by spin coating on a target substrate, such as a semiconductor wafer. Then, a heat process (baking process) is performed on the wafer to bake the coating film.

For example, Jpn. Pat. Appln. KOKAI Publication No. 2001-308089 discloses a method of forming an organosiloxane film of this kind. According to this method, a process of baking a coating film is performed at a temperature of, e.g., from 400 to 450° C. for about 30 minutes. This baking process is performed within a nitrogen atmosphere to prevent organic functional groups from decomposing.

Jpn. Pat. Appln. KOKAI Publication No. 2003-158126 (published on May 30, 2003), discloses an improved method of forming an organosiloxane film. According to this method, a catalytic gas, such as a mixture gas of ammonia and water, dinitrogen oxide gas, or hydrogen gas, is used in the baking process. In this case, the process temperature can be lowered to a temperature of from 300 to 400° C.

DISCLOSURE OF INVENTION

An object of the present invention is to provide a method and apparatus for processing an organosiloxane film, which allow an inter-level insulating film with a low dielectric constant to be formed at a low heat-processing temperature.

According to a first aspect of the present invention, there is provided a method for processing an organosiloxane film, the method comprising:

loading a target substrate with a coating film formed thereon into a reaction chamber, the coating film comprising a polysiloxane base solution having an organic functional group; and performing a heat process on the target substrate within the reaction chamber to bake the coating film, wherein the heat process comprises a temperature setting step of setting an interior of the reaction chamber at a process temperature by heating, and a supplying step of supplying a baking gas into the reaction chamber set at the process temperature, while activating the baking gas by a gas activation section disposed outside the reaction chamber.

According to a second aspect of the present invention, there is provided an apparatus for processing an organosiloxane film, by performing a heat process on a target substrate with a coating film formed thereon to bake the coating film, the coating film comprising a polysiloxane base solution having an organic functional group, the apparatus comprising:

a reaction chamber configured to accommodate the target substrate;

a temperature adjusting section configured to adjust temperature inside the reaction chamber;

a gas supply section configured to supply a baking gas into the reaction chamber;

a gas activation section disposed outside the reaction chamber and configured to activate the baking gas;

an exhaust section configured to exhaust gas inside the reaction chamber; and a control section configured to control the temperature adjusting section, the gas supply section, the gas activation section, and the exhaust section.

BRIEF DESCRIPTION OF DRAWINGS

FIG. 2 is a graph showing the relationship between the baking temperature (heat process temperature) and the specific dielectric constant of a film formed in a case where ammonia gas was employed as a baking gas; and FIG. 3 is a graph showing the relationship between the baking temperature (heat process temperature) and the specific dielectric constant of a film formed in a case where dinitrogen oxide gas was employed as a baking gas.

BEST MODE FOR CARRYING OUT THE INVENTION

Figure 1:
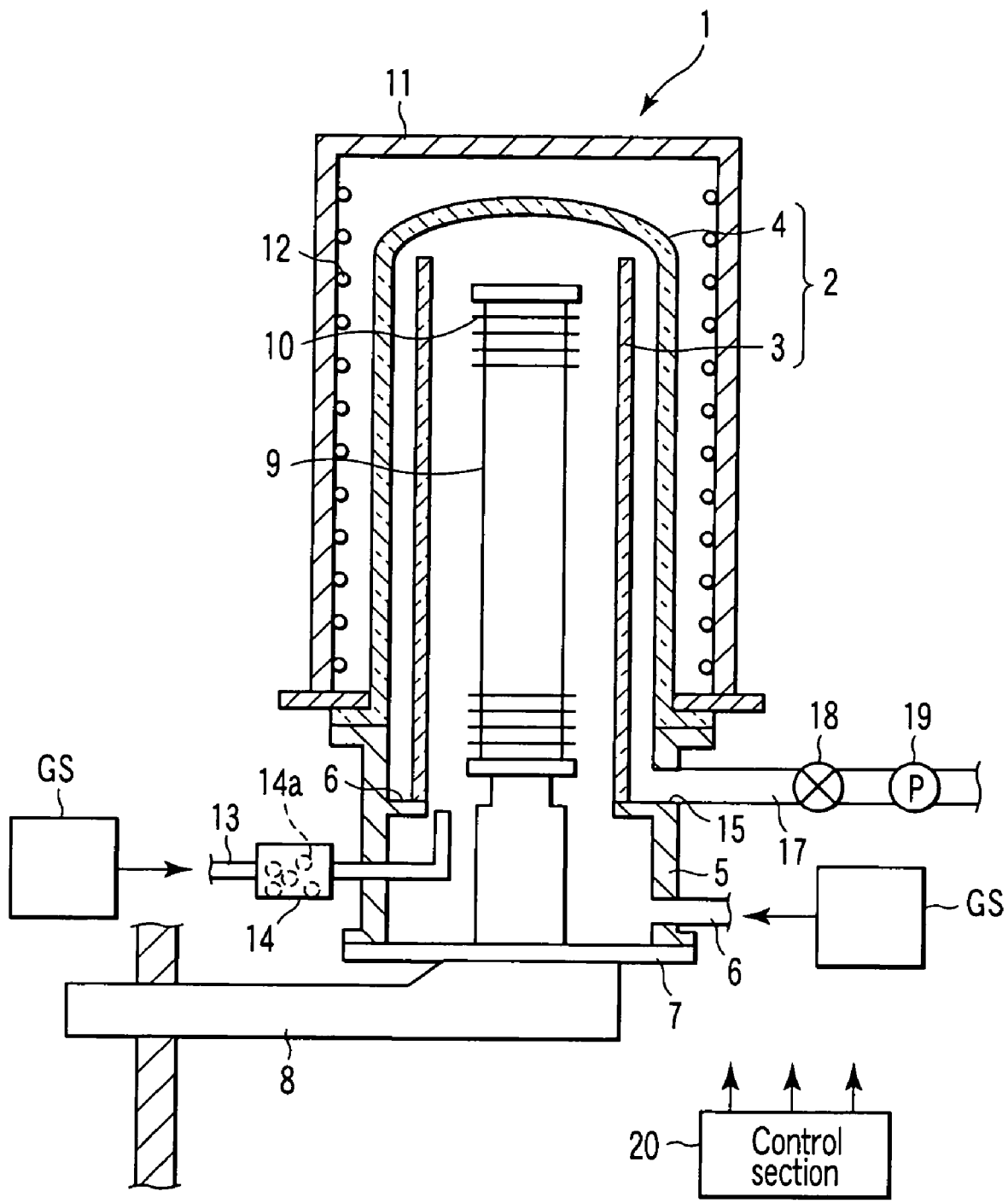
FIG. 1 is a sectional side view showing a vertical heat-processing apparatus according to an embodiment of the present invention.

As the number of multi-layered interconnection lines is increased and the structure is downsized in LSIs, inter-level insulating films used therein are required to have a lower dielectric constant property, and also to be formed at a lower process temperature. The latter is intended to alleviate the thermal history of a film earlier formed in multi-layered structures, because such a film is subjected to heat processes repeatedly performed thereafter. Further, it is an ongoing requirement to reduce the process time involved in semiconductor manufacturing. However, where the process temperature is lowered and the process time is shortened, a coating film may be insufficiently heat-processed, thereby hindering formation of an inter-level insulating film with a low dielectric constant.

Particularly, where a polysiloxane base solution is used along with a low process temperature and a short process time, formation of an insulating film with a low dielectric constant becomes difficult. This problem is thought to arise from the following mechanism. Specifically, the baking process (or heat process) is used to cause (—SiOH)'s present in an applied coating solution to inter-react with each other, thereby producing (—Si—O—Si—)'s. If the coating film is supplied with insufficient thermal energy, the reaction described above cannot propagate through the entire coating film. As a consequence, a large number of (—SiOH)'s remain in the film, which hinders the dielectric constant from decreasing.

Embodiments of the present invention achieved on the basis of the findings given above will now be described with reference to the accompanying drawings.

FIG. 1 is a sectional side view showing a vertical heat-processing apparatus of the batch type according to an embodiment of the present invention. As shown in FIG. 1, the heat-processing apparatus 1 includes a reaction tube (reaction chamber) 2, which is essentially cylindrical with a longitudinal direction directed in the vertical direction. The reaction tube 2 has a double-tube structure formed of an inner tube 3 and an outer tube 4 having a closed top, wherein the outer tube 4 covers the inner tube 3 with a constant gap interposed therebetween. The inner tube 3 and outer tube 4 are formed of a heat-resistant material, such as quartz.

A cylindrical manifold 5 made of stainless steel (SUS) is disposed below the outer tube 4. The manifold 5 is airtightly connected to the bottom of the outer tube 4. The inner tube 3 is supported by a support ring 6, which is integrally formed with the manifold 5 and extends from the inner wall of the manifold 5.

The manifold 5 is engaged with a lid 7 disposed therebelow, which is moved up and down by a boat elevator 8. When the lid 7 is moved up by the boat elevator 8, the bottom port of the manifold 5 is closed.

A wafer boat 9 made of, e.g., quartz is placed on the lid 7. The wafer boat 9 is arranged to support a plurality of semiconductor wafers (target substrates) 10, at predetermined intervals in the vertical direction. Each of the wafers 10 is provided with a coating film formed thereon. For example, the coating film consists of a coating solution containing polysiloxane having an organic functional group, which has been applied onto the semiconductor wafer 10 by spin coating. The coating film will be heat-processed (baked) by the heat-processing apparatus 1. As a consequence, an inter-level insulating film, such as an insulating film of polysiloxane having an organic functional group, which is an insulating film with a low dielectric constant, is formed on the semiconductor wafer 10.

A heat-insulating structure 11 is disposed to surround the reaction tube 2. The heat-insulating structure 11 is provided with a heater 12, such as a resistance heating body, which is disposed on the inner wall of the structure 11 and is used to raise the temperature. The interior of the reaction tube 2 is heated to a predetermined temperature by the heater 12, so that the wafers 10 are heated to a predetermined temperature.

A baking gas feed line 13 for supplying a baking gas into the reaction tube 2 is inserted through the sidewall of the manifold 5. The baking gas feed line 13 is connected to a predetermined baking gas supply source (not shown) through a mass-flow controller (not shown) and so forth inside the gas supply section GS. For example, the baking gas may be selected from ammonia gas, dinitrogen oxide gas, nitrogen oxide gas, hydrogen gas, argon gas, and nitrogen gas.

For example, as shown in FIG. 1, the baking gas feed line 13 is inserted through the sidewall of the manifold 5 at a position below the support ring 6 (below the inner tube 3). The baking gas feed line 13 is bent upward in the manifold 5 to face the interior of the inner tube 3 from below. In practice, a plurality of baking gas feed lines 13 are disposed, but FIG. 1 depicts only one of them.

Furthermore, a purge gas feed line 16 for supplying a purge gas is connected to the sidewall of the manifold 5. The purge gas feed line 16 is connected to a predetermined purge gas supply source (not shown) through a mass-flow controller (not shown) and so forth inside the gas supply section GS. The purge gas may be exemplified by an inactive gas, such as nitrogen.

The baking gas feed line 13 is provided with an activation section 14 disposed thereon for activating the baking gas. The activation section 14 is arranged to activate the baking gas by means of heat, plasma, light, or catalyst, and thus includes, e.g., heating means, plasma generation means, photolyzation means, or catalytic activation means. In this embodiment, the activation section 14 is formed of a heating device configured to heat the baking gas to a temperature for activation, ranging e.g., from 500 to 2000° C., and preferably 700 to 1000° C. The baking gas supplied from the baking gas supply source is heated and thereby activated by the heating device (activation section 14), and this activated baking gas is supplied into the reaction tube 2.

The activation section 14 may be arranged to activate the baking gas by a combination of exciting medium energy with catalytic action. For example, the catalyst consists of tungsten, platinum, or titanium oxide. In this case, the baking gas comes into contact with the catalyst, while being supplied with energy from a medium selected from the group consists of heat, light, and plasma. Where the activation section 14 of the heating device type shown in FIG. 1 is combined with a catalyst, catalytic pellets 14a or the like may be contained in the heating chamber, as indicated with broken lines in FIG. 1.

An exhaust port 15 is formed in the sidewall of the manifold 5 above the gas feed lines 13 and 16. The exhaust port 15 is formed above the support ring 6, and communicates with the space formed between the inner tube 3 and outer tube 4 of the reaction tube 2. The exhaust gas or the like generated inside the inner tube 3 is exhausted through the space formed between the inner tube 3 and outer tube 4 to the exhaust port 15.

The exhaust port 15 is airtightly connected to an exhaust line 17. The exhaust line 17 is provided with a valve 18 and a vacuum pump 19 disposed thereon in this order from the upstream side. The valve 18 adjusts the opening ratio to control the pressure inside the reaction tube 2 to a predetermined pressure. The vacuum pump 19 exhausts gas inside the reaction tube 2 through the exhaust line 17, and thereby adjusts the pressure inside the reaction tube 2. The exhaust line 17 is provided with a trap, a scrubber, and so forth (not shown) disposed thereon. The exhaust gas from the reaction tube 2 is detoxified and then exhausted out of the heat-processing apparatus 1.

The boat elevator 8, temperature-raising heater 12, baking gas feed line 13, activation section 14, purge gas feed line 16, valve 18, and vacuum pump 19 are controlled by a control section 20. The control section 20 comprises a microprocessor, a process controller, and so forth. Temperatures and pressures at respective portions of the heat-processing apparatus 1 are measured and transmitted to the control section 20. The control section 20 outputs control signals or the like to the respective portions based on the measurement data to control them. As a consequence, these portions of the heat-processing apparatus 1 are controlled in accordance with a predetermined recipe (time sequence).

Next, an explanation will be given of a heat-processing method, using the heat-processing apparatus 1 described above. This embodiment is exemplified by a method for processing an organosiloxane film. In summary, a coating film of a polysiloxane base solution having an organic functional group is formed by spin coating on a target substrate or semiconductor wafer. Then, the wafer is subjected to a heat process (baking process) to bake the coating film.

Specifically, a coating film of a polysiloxane base solution is formed on a semiconductor wafer by, e.g., spin coating and drying performed thereon. The solution contains a bond of a silicon atom with a functional group selected from the group consisting of a methyl group ($—CH_3$), phenyl group ($—C_6H_5$), and vinyl group ($—CH=CH_2$).

The polysiloxane is prepared by hydrolyzing a silane compound having a hydrolyte group under the existence or non-existence of a catalytic agent to condense it. A preferable example of a silane compound containing a hydrolyte group is trimethoxysilane, triethoxysilane, methyltrimethoxysilane, methyltriethoxysilane, methyltri-n-propoxysilane, methyltri-iso-propoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, diphenyldiethoxysilane, tetramethoxysilane, tetraethoxysilane, tetra-n-propoxysilane, tetra-iso-propoxysilane, tetra-n-butoxysilane, tetra-sec-butoxysilane, tetra-tert-butoxysilane, or tetraphenoxysilane.

The catalytic agent used in hydrolysis may be an acid, chelate compound, or alkali, and is preferably an alkali, such as ammonia or alkylamine.

The molecular weight of polysiloxane is 100,000 to 10,000,000, preferably 100,000 to 9,000,000, and more preferably 200,000 to 8,000,000 in weight-average molecular weight obtained by polystyrene conversion in accordance with a GPC method. Where it is less than 50,000, the dielectric constant and elastic modulus may be insufficient. Where it is greater than 10,000,000, the uniformity of a coating film may be lowered.

It is preferable to use a polysiloxane base solution that satisfies the following formula.

$0.9 \geq R/Y \geq 0.2$ (where R denotes the atomicity of the methyl group, phenyl group, or vinyl group, and Y denotes the atomicity of Si, both in polysiloxane).

The polysiloxane base solution (coating solution) is prepared by dissolving such polysiloxane into an organic solvent. A concrete example of a solvent to be used for this is at least one selected from the group consisting of an alcohol base solvent, ketone base solvent, amide base solvent, and ester base solvent. In addition to polysiloxane, the coating solution may contain an arbitrary component, such as a surfactant, or pyrolytic polymer, as needed.

A wafer 10 with a coating film thus formed thereon is subjected to a heat process by the heat-processing apparatus 1 in a sequence as follows. In this sequence, the control section 20 controls respective portions of the heat-processing apparatus 1 explained below.

At first, the interior of the reaction tube 2 is heated by the temperature-raising heater 12 at a predetermined baking temperature of, e.g., from 250 to 400° C. On the other hand, the wafer boat 9 holding semiconductor wafers 10 each with the coating film formed thereon is placed on the lid 7 that has been moved down by the boat elevator 8. Then, the lid 7 is moved up by the boat elevator 8 to load the semiconductor wafers 10 into the reaction tube 2. As a consequence, the semiconductor wafers 10 are accommodated inside the inner tube 3 of the reaction tube 2, and the reaction tube 2 is airtightly closed.

After the reaction tube 2 is airtightly closed, the opening ratio of the valve 18 is adjusted, and the vacuum pump 19 is driven to exhaust gas inside the reaction tube 2, thereby starting pressure reduction of the reaction tube 2. The interior of the reaction tube 2 is kept exhausted until the pressure inside the reaction tube 2 is reduced to a predetermined pressure.

After the interior of the reaction tube 2 is stabilized at the predetermined pressure, a baking gas is supplied into the baking gas feed line 13 at a predetermined flow rate from the baking gas supply source of the gas supply section GS. The baking gas supplied into the baking gas feed line 13 then flows through the heating device (activation section 14), where it is heated up to a temperature ranging from 700 to 1000° C., and thus activated. The activated baking gas is continuously supplied through the baking gas feed line 13 into the reaction tube 2 heated at the baking temperature. Under this state, the coating film on the semiconductor wafers 10 is heated for a predetermined time, and thereby subjected to baking (heat process). As a consequence, an inter-level insulating film (organosiloxane film) is formed on each semiconductor wafer 10.

The coating film on the semiconductor wafers 10 is subjected to baking (heat process) while the activated baking gas is supplied, so the baking reaction of the coating film is promoted. In this case, even where the heat process temperature is set to be lower than a conventional value ranging from 400 to 450° C., the baking reaction sufficiently proceeds, whereby an inter-level insulating film with a low dielectric constant is formed. The baking temperature for the coating film is preferably set to be not more than 400° C., such as a temperature ranging from 250 to 400° C., which is lower than the conventional heat process temperature. If the heat process temperature is set to be lower than 250° C., the baking reaction may insufficiently proceed, even where the activated baking gas is used.

Further, in this case, even where the heat process time is shortened, the baking reaction sufficiently proceeds, whereby an inter-level insulating film with a low dielectric constant is formed. It suffices if the heat process time is set at, e.g., 5 minutes or more. However, if the heat process time is too long, a film on the lower side may suffer a problem related to a thermal history. For this reason, the heat process time is preferably set at 60 minutes or less.

Returning to the explanation on steps of the heat-processing method, nitrogen is then supplied through the purge gas feed line 16 at a predetermined flow rate, while the opening ratio of the valve 18 is adjusted and the vacuum pump 19 is driven, to exhaust gas inside the reaction tube 2 through the exhaust line 17. It is preferable to perform cyclic purge, in which the gas exhaust and nitrogen gas supply for the interior of the process tube 2 are repeated a plurality of times, in order to swiftly and reliably exhaust the gas inside the process tube 2. Subsequently, the pressure inside the process tube 2 is returned to atmospheric pressure, and the lid 7 is moved down by the boat elevator 8, thus the semiconductor wafers 10 are unloaded.

In order to examine some of the effects of this embodiment, an experiment was conducted to form an inter-level insulating film under different conditions, and measure the specific dielectric constant of the film thus formed. More specifically, comparison was made between a case where a baking gas was activated immediately before being supplied into the reaction tube 2, and a case where the baking gas was not activated, when semiconductor wafers 10 with a coating film formed thereon were subjected to a heat process (baking), using the heat-processing apparatus 1. In two present examples using an activated baking gas, ammonia gas and dinitrogen oxide gas were respectively employed as the baking gas. In three comparative examples using a non-activated baking gas, nitrogen gas, ammonia gas, and dinitrogen oxide gas were respectively employed as the baking gas.

In each of the cases, the pressure inside the reaction tube 2 was set at 13.3 kPa (100 Torr), the heat process temperature at 300° C., the heat process time at 30 minutes, and the flow rate of the baking gas at 0.5 liters/minute. The coating film was formed by spin-coating a coating solution containing polysiloxane having an organic functional group onto each semiconductor wafer 10. After the heat process on the coating film was performed to form an inter-level insulating film, an electrode pattern consisting of aluminum or a mixture of aluminum and copper was formed on the inter-level insulating film to form a sample. Then, the specific dielectric constant of the inter-level insulating film of this sample was measured by a CV method, at a frequency of 100 kHz, using an LCR meter.

FIG. 2 is a graph showing the relationship between the baking temperature (heat process temperature) and the specific dielectric constant of a film formed in a case where ammonia gas was employed as the baking gas. FIG. 2 also shows data obtained in a case where non-activated nitrogen gas was employed (a gas conventionally employed). As show in FIG. 2, where activated ammonia gas was employed as the baking gas, an inter-level insulating film with a low dielectric constant was formed, although a lower baking temperature was used, as compared with a case where non-activated nitrogen gas or non-activated ammonia gas was employed.

For example, the specific dielectric constant of an inter-level insulating film formed by baking with activated ammonia gas and a baking temperature of 300° C. was almost the same as the specific dielectric constant of an inter-level insulating film formed by baking with non-activated nitrogen gas and a baking temperature of 420° C. In other words, it was confirmed that, in spite of a lower baking temperature of 300° C. being used for the coating film, ammonia gas used in accordance with the heat process method according to this embodiment allowed an inter-level insulating film to be formed with a dielectric constant as low as that obtained by the conventional technique. It is thought that a lower baking temperature for the coating film enabled such an inter-level insulating film with a low dielectric constant to be formed, because the activated baking gas was supplied in baking the coating film on the semiconductor wafers 10, thereby promoting the baking reaction of the coating film.

FIG. 3 is a graph showing the relationship between the baking temperature (heat process temperature) and the specific dielectric constant of a film formed in a case where dinitrogen oxide gas was employed as the baking gas. FIG. 3 also shows data obtained in a case where non-activated nitrogen gas was employed (a gas conventionally employed). As show in FIG. 3, where activated dinitrogen oxide gas was employed as the baking gas, an inter-level insulating film with a low dielectric constant was formed, although a lower baking temperature was used, as compared with a case where non-activated nitrogen gas or non-activated dinitrogen oxide gas was employed.

For example, the specific dielectric constant of an inter-level insulating film formed by baking with activated dinitrogen oxide gas and a baking temperature of 300° C. was almost the same as the specific dielectric constant of an inter-level insulating film formed by baking with non-activated nitrogen gas and a baking temperature of 420° C. In other words, it was confirmed that, in spite of a lower baking temperature of 300° C. being used for the coating film, dinitrogen oxide gas used in accordance with the heat process method according to this embodiment allowed an inter-level insulating film to be formed with a dielectric constant as low as that obtained by the conventional technique.

In order to study the influence of pressure on the specific dielectric constant of an inter-level insulating film, an experiment was conducted. As a result, it was confirmed that the specific dielectric constant did not substantially change with change in pressure.

The preferable supply rate of the baking gas differs, depending on the size of the heat-processing apparatus 1 and the number of semiconductor wafers 10 to be loaded. For example, in the case of a heat-processing apparatus which employs a wafer boat 9 configured to load 170 semiconductor wafers 10 of 8 inches at most, the supply rate of the baking gas is preferably set to be within a range of from 0.01 to 10 liters/minute, and more preferably within a range of from 0.1 to 2 liters/minute.

As described above, according to this embodiment, the coating film on the semiconductor wafers 10 is subjected to baking while the activated baking gas is supplied, so the baking reaction of the coating film is promoted. As a consequence, even where the heat process temperature is set to be lower, an inter-level insulating film with a low dielectric constant is formed.

The present invention is not limited to the embodiment described above, and it may be modified or applied in various manners. Next, an explanation will be given of other possible embodiments of the present invention.

In the embodiment described above, a coating film is formed on a semiconductor wafer 10 by spin-coating a coating solution containing polysiloxane having an organic functional group, and the coating film thus formed is subjected to baking to form an inter-level insulating film. For example, the coating solution containing polysiloxane having an organic functional group is prepared by dissolving polysiloxane having an organic functional group into an organic solvent. This solution may contain an arbitrary component, such as a surfactant, added thereto. An example of an inter-level insulating film thus formed is a film of porous MSQ (methyl silsesquioxan) or MSQ. Where an inter-level insulating film consists of porous MSQ, the film includes pores with a size in molecular or atomic order, such as 20 nm or less, formed therein.

In the embodiment described above, ammonia gas or dinitrogen oxide gas is used as a baking gas. However, another gas may be used as the baking gas, as far as it can promote the baking reaction without affecting the baking reaction. For example, the baking gas may consist of nitrogen oxide gas, hydrogen gas, argon gas, or nitrogen gas.

In the embodiment described above, the activation section 14 is formed of a heating device. However, the activation section 14 is merely required to activate the baking gas. For example, the activation section 14 may be formed of plasma generation means, photolyzation means, catalytic activation means, or a combination thereof.

In the embodiment described above, the processing apparatus is exemplified by a vertical heat-processing apparatus of the batch type with the reaction tube 2 having a double-tube structure, which is formed of the inner tube 3 and outer tube 4. However, the present invention may be applied to a heat-processing apparatus of the batch type with a process container having a single-tube structure, from which the inner tube 3 is excluded. Alternatively, the present invention may be applied to a heat-processing apparatus of the single-substrate type.

INDUSTRIAL APPLICABILITY

According to the present invention, where a polysiloxane based coating film formed on a substrate is subjected to a heat process to form an inter-level insulating film, an inter-level insulating film with a low dielectric constant can be formed even at a low heat process temperature.

The invention claimed is:

1. A method for processing an organosiloxane film, the method comprising:
   loading a target substrate with a coating film formed thereon into a reaction chamber, the coating film comprising a polysiloxane base solution having an organic functional group; and
   performing a heat process on the target substrate within the reaction chamber to bake the coating film, wherein the heat process comprises:
   a temperature setting step of setting an interior of the reaction chamber at a process temperature by heating, and a supplying step of supplying a baking gas into the reaction chamber set at the process temperature, while activating the baking gas by a gas activation section disposed outside the reaction chamber, the gas activation section activating the baking gas by bringing the baking gas into contact with a catalyst while supplying the baking gas with heat energy, wherein:

the baking gas is selected from the group consisting of ammonia gas and dinitrogen oxide gas, the catalyst is tungsten, and the gas activation section is configured to heat the baking gas to a temperature of from 700 to 1,000° C.

2. The method according to claim 1, wherein the process temperature ranges from 250 to 400° C.

3. The method according to claim 1, wherein the reaction chamber is configured to accommodate a plurality of target substrates at intervals in a vertical direction, said loading comprising loading the plurality of target substrates.

* * * * *